(12) United States Patent
Liang et al.

(10) Patent No.: US 8,975,700 B2
(45) Date of Patent: Mar. 10, 2015

(54) SEMICONDUCTOR DEVICE HAVING A TRENCH ISOLATION STRUCTURE

(75) Inventors: Qingqing Liang, Lagrangeville, NY (US); Huilong Zhu, Poughkeepsie, NY (US); Huicai Zhong, San Jose, CA (US)

(73) Assignee: Institute Microelectronics, Chinese Academy of Sciences, Beijing (CN)

( * ) Notice: Subject to any disclaimer, the term of this patent is extended or adjusted under 35 U.S.C. 154(b) by 125 days.

(21) Appl. No.: 13/380,806

(22) PCT Filed: Aug. 9, 2011

(86) PCT No.: PCT/CN2011/001308
§ 371 (c)(1),
(2), (4) Date: Dec. 23, 2011

(87) PCT Pub. No.: WO2011/001308
PCT Pub. Date: Jan. 6, 2011

(65) Prior Publication Data
US 2013/0015526 A1  Jan. 17, 2013

(30) Foreign Application Priority Data
Jul. 14, 2011  (CN) .......................... 2011 1 0197158

(51) Int. Cl.
*H01L 27/12*  (2006.01)
*H01L 29/78*  (2006.01)
(Continued)

(52) U.S. Cl.
CPC ..... *H01L 29/7849* (2013.01); *H01L 21/823807* (2013.01); *H01L 21/84* (2013.01); *H01L 27/1203* (2013.01)
USPC .............. 257/351; 257/18; 257/204; 257/347

(58) Field of Classification Search
USPC .............. 257/18, 19, 20, 396, 190, 192, 288, 257/204, 351, 347
See application file for complete search history.

(56) References Cited

U.S. PATENT DOCUMENTS

| 7,816,766 B2 | 10/2010 | Tamura et al. ............... 257/616 |
| 7,842,982 B2 | 11/2010 | Moriyama et al. ........... 257/255 |
| 2005/0087803 A1* | 4/2005 | Hara et al. .................... 257/347 |

(Continued)

FOREIGN PATENT DOCUMENTS

| CN | 1713396 A | 12/2005 | .............. H01L 29/78 |
| CN | 1822392 A | 8/2006 | .............. H01L 29/78 |
| JP | 2008-262954 A | 10/2008 | .......... H01L 21/8238 |

OTHER PUBLICATIONS

Chinese Office Action, ISR, Sep. 17, 2014, CPPH1130183N.

*Primary Examiner* — Thanh Y Tran
(74) *Attorney, Agent, or Firm* — Martine Penilla Group, LLP (57) ABSTRACT

The invention relates to a semiconductor device and a method for manufacturing such a semiconductor device. A semiconductor device according to an embodiment of the invention comprises: a substrate which comprises a base layer, an insulating layer on the base layer, and a semiconductor layer on the insulating layer; and a first transistor and a second transistor formed on the substrate, the first and second transistors being isolated from each other by a trench isolation structure formed in the substrate. Wherein at least a part of the base layer under at least one of the first and second transistors is strained, and the strained part of the base layer is adjacent to the insulating layer. The semiconductor device according to the invention increases the speed of the device and thus improves the performance of the device.

9 Claims, 8 Drawing Sheets

(51) Int. Cl.
*H01L 21/84* (2006.01)
*H01L 21/8238* (2006.01)

(56) References Cited

U.S. PATENT DOCUMENTS

| | | | |
|---|---|---|---|
| 2005/0285175 A1 | 12/2005 | Cheng et al. | 257/302 |
| 2006/0186436 A1 | 8/2006 | Tamura et al. | 257/192 |
| 2007/0178638 A1 | 8/2007 | Gotoh et al. | 438/221 |
| 2007/0290264 A1 | 12/2007 | Sugii et al. | 257/348 |
| 2008/0135873 A1* | 6/2008 | Fiorenza et al. | 257/190 |
| 2008/0303090 A1* | 12/2008 | Ieong et al. | 257/351 |
| 2009/0072312 A1* | 3/2009 | Chang et al. | 257/351 |
| 2009/189199 A1 | 7/2009 | Moriyama et al. | 257/255 |
| 2009/0321840 A1 | 12/2009 | Pidin | 257/369 |
| 2012/0074494 A1* | 3/2012 | Bedell et al. | 257/347 |

* cited by examiner

SEMICONDUCTOR DEVICE HAVING A TRENCH ISOLATION STRUCTURE

CLAIM OF PRIORITY

This application is a National Phase application of, and claims priority to, PCT Application No. PCT/CN2011/001308, filed on Aug. 9, 2011, entitled "Semiconductor device and method for manufacturing the same", which claimed priority to Chinese Application No. 201110197158.9, filed on Jul. 14, 2011. Both the PCT Application and Chinese Application are incorporated herein by reference in their entireties.

FIELD OF THE INVENTION

The invention relates to a semiconductor device. More particularly, the invention relates to a semiconductor device comprising a transistor. The invention also relates to a method for manufacturing such a semiconductor device.

BACKGROUND OF THE INVENTION

In the current semiconductor integrated circuit, an SOI (Semiconductor-On-Insulator) or UTSOI (Ultra Thin Semiconductor-On-Insulator) technology gets more and more widely used. For example, for a CMOS device with a thickness of sub-22 nm, the UTSOI technology is a very promising technology.

However, for a semiconductor device using the SOI or UTSOI technology, a key problem lies in that it is difficult to improve the performance of the device, in particular the speed of the device. It is difficult for conventional stress technologies to enhance mobility such as stress liner, SiGe/SiC embedded in the source/drain region, etc. to be applied due to a smaller gate spacing and a thinner intrinsic source/drain region.

Therefore, there is a need for a solution capable of improving the performance of a SOI semiconductor device, in particular the speed of the device.

SUMMARY OF THE INVENTION

An object of the invention is to overcome at least some of the above drawbacks and provide an improved semiconductor device and a method for manufacturing the same.

According to an aspect of the invention, there is provided a semiconductor device comprising: a substrate, which comprises a base layer, an insulating layer, and a semiconductor layer, the insulating layer being on the base layer, and the semiconductor layer being on the insulating layer; and a first transistor and a second transistor, which are formed on the substrate, the first and second transistors being isolated from each other by a trench isolation structure in the substrate, wherein at least a part of the base layer under at least one of the first and second transistors is strained, and the strained part of the base layer is adjacent to the insulating layer.

According to another aspect of the invention, there is provided a method for manufacturing a semiconductor device, comprising: providing a substrate which comprises a base layer, an insulating layer, and a semiconductor layer, the insulating layer being on the base layer, and the semiconductor layer being on the insulating layer; forming an isolating trench in the substrate; non-crystallizing at least a part of the base layer on at least one side of the isolating trench, the non-crystallized part of the base layer being adjacent to the insulating layer; forming a stress film which covers the bottom and an inner wall of the isolating trench; forming a dielectric material on the stress film to fill the isolating trench; recrystallizing the non-crystallized part of the base layer so as to form a strained part of the base layer; and forming a first transistor and a second transistor on the substrate and on opposite sides of the isolating trench.

BRIEF DESCRIPTION OF THE DRAWINGS

These and other objects, features and advantages of the invention will become more apparent from the following detailed description of the exemplary embodiments of the invention with reference to the accompanying drawings. In the drawings.

DETAILED DESCRIPTION OF THE INVENTION

Exemplary embodiments of the invention will be described in detail with reference to the accompanying drawings hereinafter. The drawings are schematic and not drawn to scale, and just for illustrating the embodiments of the invention and are not intended to limit the protective scope of the invention. In the drawings, like reference numerals denote identical or similar components. For making the technical solution of the invention clearer, process steps and structures of a device known in the art are omitted herein.

Firstly, a semiconductor device according to an exemplary embodiment of the invention will be described in detail with reference to FIG. 1.

Figure 1:
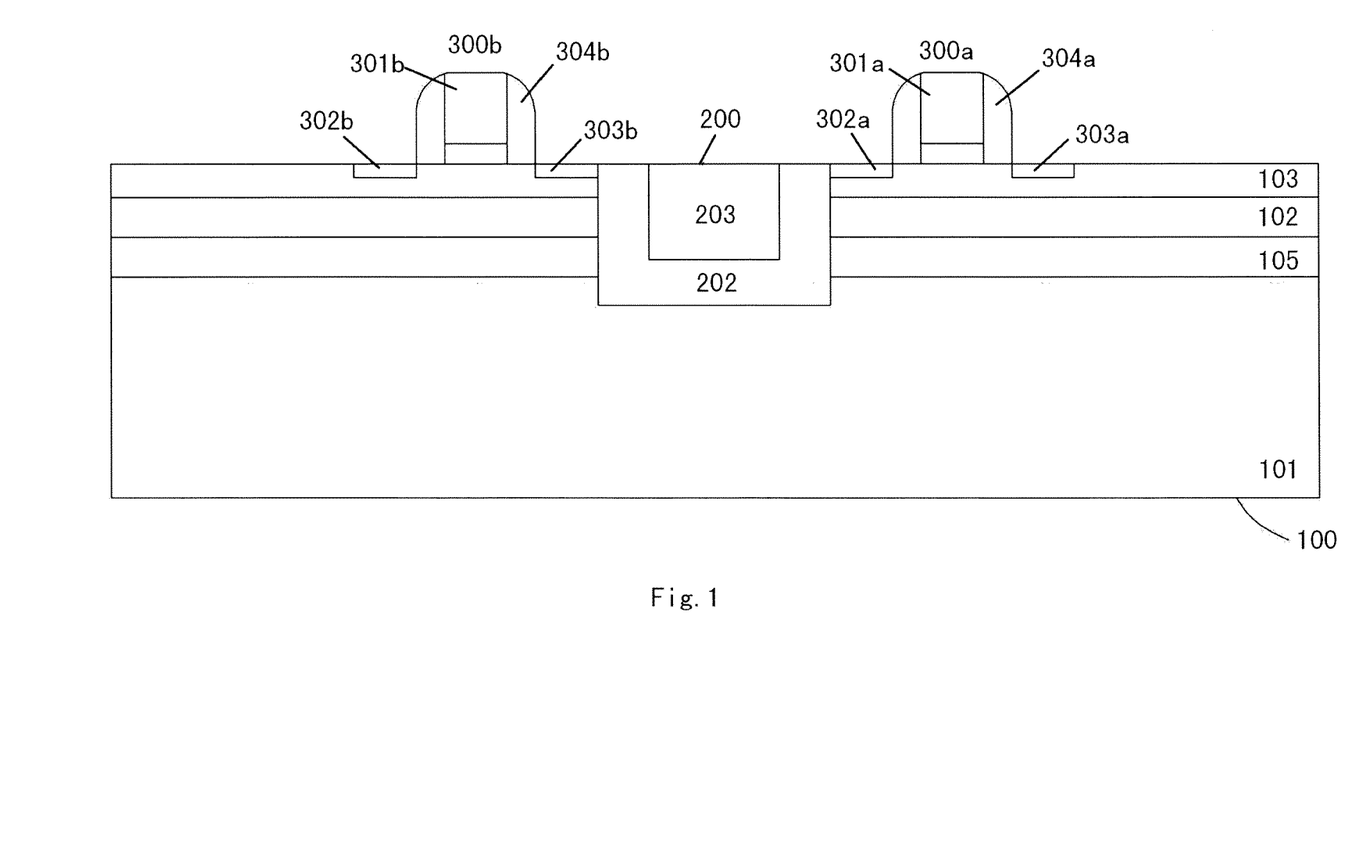
FIG. 1 shows a schematic cross section view of a semiconductor device according to an exemplary embodiment of the invention.

FIG. 1 shows a schematic cross section view of a semiconductor device according to an exemplary embodiment of the invention.

As shown in FIG. 1, the semiconductor device according to an exemplary embodiment of the invention comprises a substrate 100 and a first transistor 300a and a second transistor 300b formed on the substrate 100. The substrate 100 comprises a base layer 101, an insulating layer 102 on the base layer 101 and a semiconductor layer 103 on the insulating layer 102. As an example, the base layer 101 may be formed from a semiconductor material. For example, the base layer 101 may comprise silicon, or a combination of silicon and silicon dioxide. The base layer 101 may also be formed by the superposition of a plurality of layers. The insulating layer 102 may for example comprise, but not limited to, a material or a combination of materials selected from a group made up of the following materials: silicon dioxide, silicon nitride, etc. The semiconductor layer 103 may for example comprise, but not limited to, a material or a combination of materials selected from a group made up of the following materials: silicon, silicon germanium, silicon carbide, etc.

The first and second transistors 300*a* and 300*b* may be isolated from each other by a trench isolation structure 200 formed in the substrate 100. The trench isolation structure 200 may pass through the semiconductor layer 103, the insulating layer 102 and a part of the base layer 101. As an example, the trench isolation structure 200 may comprise a stress film 202 on the bottom and an inner wall of the trench of the trench isolation structure, and a dielectric material 203 formed on the stress film 202 to fill the trench of the trench isolation structure. The material used to form the stress film 202 may comprise, but not limited to, nitride. In an example, the stress film 202 may comprise, but not limited to, a material or a combination of materials selected from a group made up of the following materials: silicon nitride, boron nitride, etc. The dielectric material may comprise, but not limited to, a material or a combination of materials selected from a group made up of the following materials: silicon dioxide, silicon nitride, etc.

At least a part 105 of the base layer 101 under at least one of the first and second transistors 300*a* and 300*b* is strained, and the strained part 105 of the base layer 101 is adjacent to the insulating layer 102. In an example, the strained part 105 of the base layer 101 may also be adjacent to the stress film 202 of the trench isolation structure 200. During the operation of the transistors, the strained part of the base layer may increase the mobility of carriers in a channel of the transistors, thereby increasing the speed of the device and thus improving the performance of the device. It is to be noted that, while it is illustrated in FIG. 1 that the base layer under both the first and second transistors 300*a* and 300*b* comprises a strained part, the invention is not limited thereto. Those skilled in the art may, according to the requirements of a particular application or a circuit design, make the base layer under one of the first and second transistors comprise a strained part. Just as described above, at least a part of the base layer under at least one of the first and second transistors is strained.

Optionally, the substrate 100 may also comprise a buried insulating layer (not shown) in the base layer 101, and the strained part of the base layer may be located above the buried insulating layer.

In the exemplary embodiment shown in FIG. 1, the first transistor 300*a* may comprise a first gate stack 301*a* on the semiconductor layer 103 of the substrate 100, and a first source region 302*a* and a first drain region 303*a* on opposite sides of the first gate stack 301*a*, and the second transistor 300*b* may comprise a second gate stack 301*b* on the semiconductor layer 103 of the substrate 100, and a second source region 302*b* and a second drain region 303*b* on opposite sides of the second gate stack 301*b*. The first gate stack may comprise a first gate dielectric and a first gate electrode formed on the first gate dielectric. The second gate stack may comprise a second gate dielectric and a second gate electrode formed on the second gate dielectric. Optionally, as shown in FIG. 1, the first transistor 300*a* may also comprise a first spacer isolating layer 304*a* formed on a sidewall of the first gate stack 301*a*, and the second transistor 300*b* may also comprise a second spacer isolating layer 304*b* formed on a sidewall of the second gate stack 301*b*. It is worth noting that, the structure of the first and second transistors of the invention is not limited to that shown in FIG. 1, and the first and second transistors may be other type of transistor. Those skilled in the art may select or determine the particular structure of the first and second transistors as desired.

The first and second transistors 300*a* and 300*b* may both be an N-type transistor or a P-type transistor. In an example, one of the first and second transistors 300*a* and 300*b* is an N-type transistor, the other is a P-type transistor, and such first and second transistors may constitute a CMOS device. In such a case, each and every portion of the base layer under both of the N-type transistor and the P-type transistor has at least a strained part, wherein the strained part of the portion of the base layer under the N-type transistor has a tensile strain, and the strained part of the portion of the base layer under the P-type transistor has a compressive strain. Thus, both the speeds of the N-type transistor and the P-type transistor may be increased, thereby improving the performance of the semiconductor device as a whole.

In the following a method for manufacturing a semiconductor device according to an exemplary embodiment of the invention will be described in detail with reference to FIGS. 2A-2G.

Figure 2A:
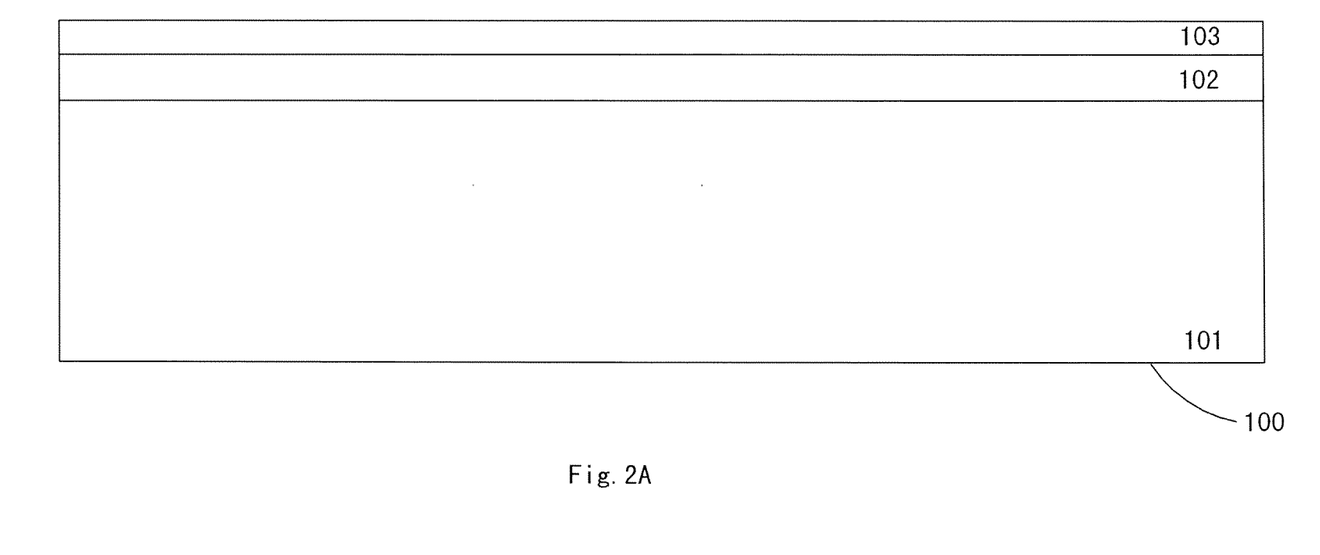
FIG. 2A shows the first step of a method for manufacturing a semiconductor device according to an exemplary embodiment of the invention.

FIG. 2A shows the first step of a method for manufacturing a semiconductor device according to an exemplary embodiment of the invention. In this step, a substrate 100 is provided. The substrate 100 comprises a base layer 101, an insulating layer 102 on the base layer 101 and a semiconductor layer 103 on the insulating layer 102. As an example, the base layer 101 may be formed from a semiconductor material. For example, the base layer 101 may comprise silicon, or a combination of silicon and silicon dioxide. The base layer 101 may also be formed by the superposition of a plurality of layers. The insulating layer 102 may for example comprise, but not limited to, a material or a combination of materials selected from a group made up of the following materials: silicon dioxide, silicon nitride, etc. The semiconductor layer 103 may for example comprise, but not limited to, a material or a combination of materials selected from a group made up of the following materials: silicon, silicon germanium, silicon carbide, etc.

Optionally, the substrate 100 may also comprise a buried insulating layer (not shown) located in the base layer 101.

Figure 2B:
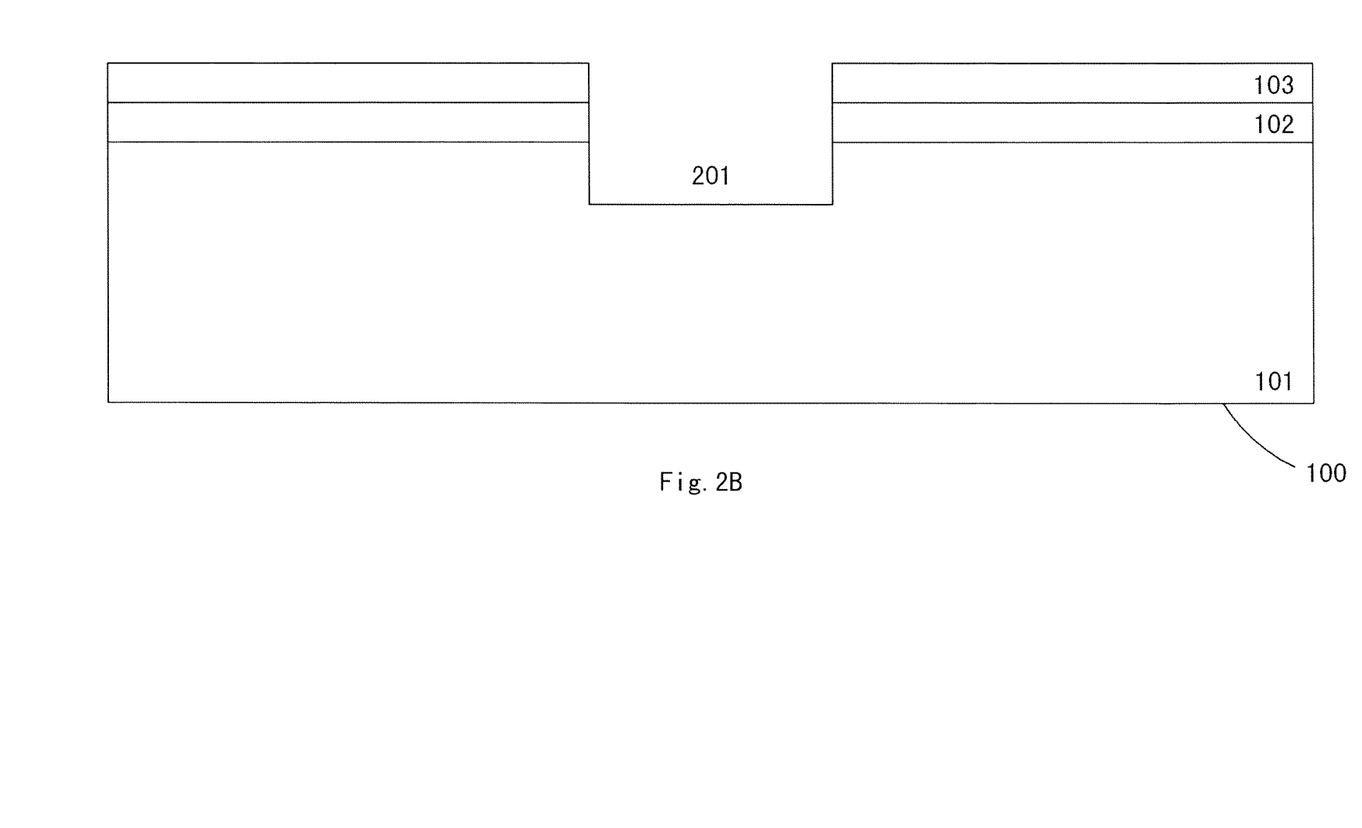
FIG. 2B shows the second step of a method for manufacturing a semiconductor device according to an exemplary embodiment of the invention.

FIG. 2B shows the second step of a method for manufacturing a semiconductor device according to an exemplary embodiment of the invention. In this step, an isolating trench 201 is formed in the substrate 100. The isolating trench 201 may pass through the semiconductor layer 103, the insulating layer 102 and a part of the base layer 101.

In an example, the isolating trench may be formed by etching. In an example where the substrate 100 comprises a buried insulating layer (not shown) located in the base layer 101, the isolating trench 201 may be formed to pass through the semiconductor layer 103, the insulating layer 102 and a part of the base layer 101 to extend to the upper surface of the buried insulating layer. In such a case, the buried insulating layer is for example used as an etching stopping layer for forming the isolating trench.

Figure 2C:
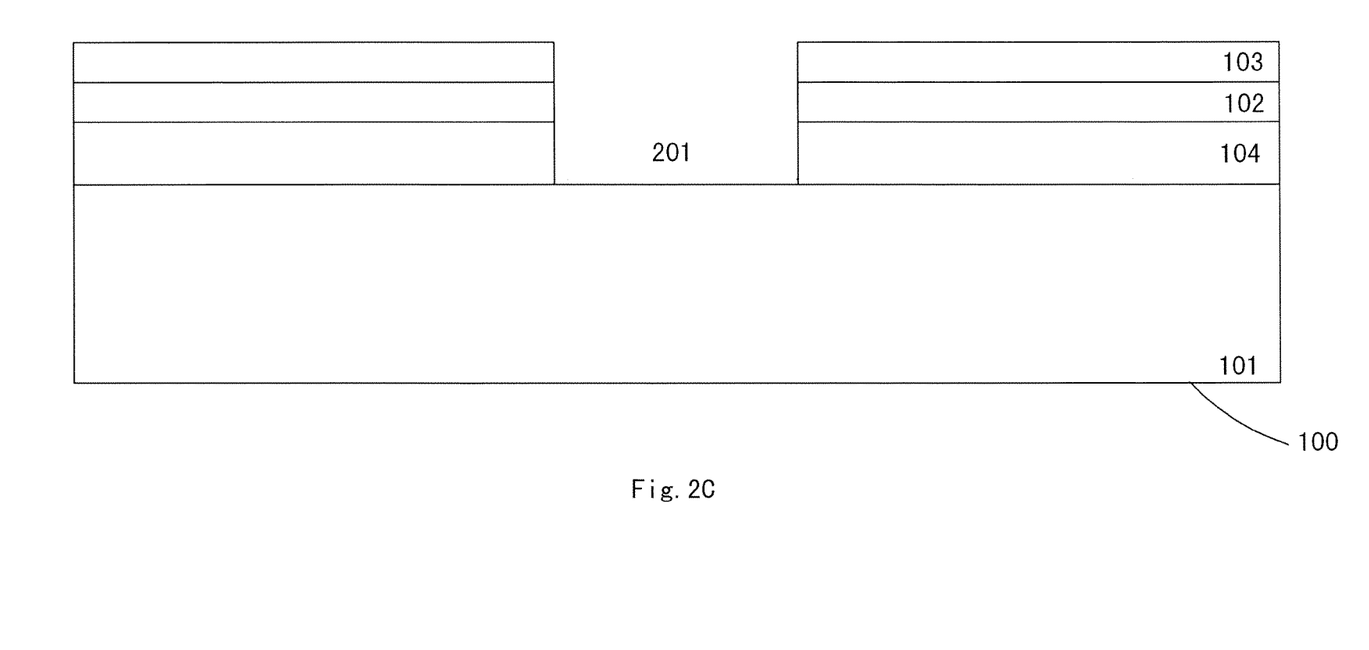
FIG. 2C shows the third step of a method for manufacturing a semiconductor device according to an exemplary embodiment of the invention.

FIG. 2C shows the third step of a method for manufacturing a semiconductor device according to an exemplary embodiment of the invention. In this step, at least a part of the base layer 101 on at least one side of the isolating trench 201 is non-crystallized, and the non-crystallized part 104 of the base layer 101 is adjacent to the insulating layer 102.

In an example, at least a part of the base layer 101 under the insulating layer 102 and on at least one side of the isolating trench 201 is non-crystallized by ion implantation. The ion implantation may for example be an angled ion implantation. By the process of ion implantation, the ions implanted may pass through the semiconductor layer 103 and the insulating layer 102, non-crystallizing at least a part of the base layer 101 adjacent to the insulating layer 102. The ions implanted may for example be germanium or xenon, etc.

It is worth noting that, while it is illustrated in FIG. 2C that the bottom of the non-crystallized part 104 of the base layer 101 is in the same horizontal plane as the bottom of the isolating trench 201, the invention is not limited thereto. Those skilled in the art may select the depth of the non-crystallized part 104 as desired. For example, the depth of the non-crystallized part 104 may be controlled by controlling the energy of the implanted ions or the angle of the ion implantation or the like when ions are being implanted.

In addition, it is also worth noting that, while it is illustrated in FIG. 2C that the base layer 101 located under the insulating layer 102 on opposite sides of the isolating trench 201 is made to comprise a non-crystallized part 104, the invention is not limited thereto. Those skilled in the art may, according to the requirements of a particular application or a circuit design, make the base layer 101 located under the insulating layer 102 on one of both the sides of the isolating trench 201 comprise a non-crystallized part 104. In an example, this may be achieved by masking the substrate on one side of the isolating trench and performing the ion implantation on the substrate on the other side of the isolating trench. Just as described above, in the third step of a method for manufacturing a semiconductor device according to an exemplary embodiment of the invention, at least a part of the base layer 101 located under the insulating layer 102 and on at least one side of the isolating trench 201 is non-crystallized.

Figure 2D:
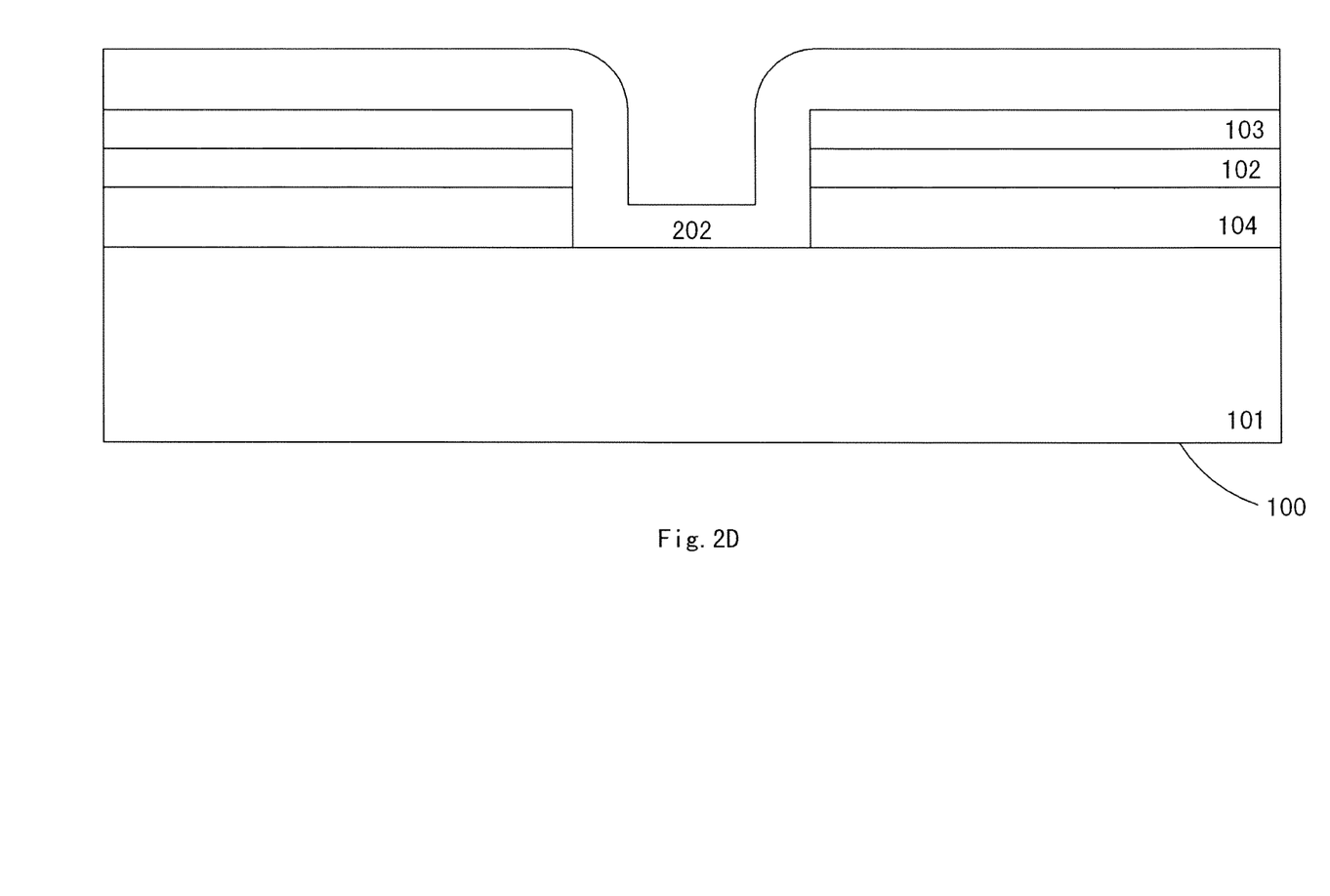
FIG. 2D shows the fourth step of a method for manufacturing a semiconductor device according to an exemplary embodiment of the invention.

FIG. 2D shows the fourth step of a method for manufacturing a semiconductor device according to an exemplary embodiment of the invention. In this step, a stress film 202 is formed, the stress film 202 covers the bottom and an inner wall of the isolating trench. The stress film 202 may be formed by deposition, for example. The stress film 202 is strained. The material for forming the stress film 202 may comprise, but not limited to, nitride. In an example, the stress film 202 may comprise, but not limited to, a material or a combination of materials selected from a group made up of the following materials: silicon nitride, boron nitride, etc.

Optionally, the stress film 202 may also cover portions of the substrate which are at both sides of and adjacent to the isolating trench in addition to covering the bottom and an inner wall of the isolating trench, as shown in FIG. 2D.

If it is desirable to form an N-type transistor on the substrate 100 subsequently, the stress film 202 may be formed to be a stress film having a tensile strain. If it is desirable to form a P-type transistor on the substrate 100 subsequently, the stress film 202 may be formed to be a stress film having a compressive strain. In an example, it is desirable to form respectively an N-type transistor and a P-type transistor on the substrate on opposite sides of the isolating trench to form a CMOS device in a subsequent step. In this case, a stress film having a tensile strain can be formed on at least a part of the bottom of the isolating trench and one of the inner walls of the isolating trench and a stress film having a compressive strain can be formed on the remaining part of the bottom of the isolating trench and another inner wall of the isolating trench. In an example, this may be achieved in the following way: masking at least a part of the bottom of the isolating trench and one of the inner walls of the isolating trench, and forming a stress film having a compressive strain on the remaining part of the bottom of the isolating trench and another inner wall of the isolating trench; afterwards, masking the part of the iso- lating trench where a stress film is already formed, and forming a stress film having a tensile strain on the remaining part in the isolating trench.

Figure 2E:
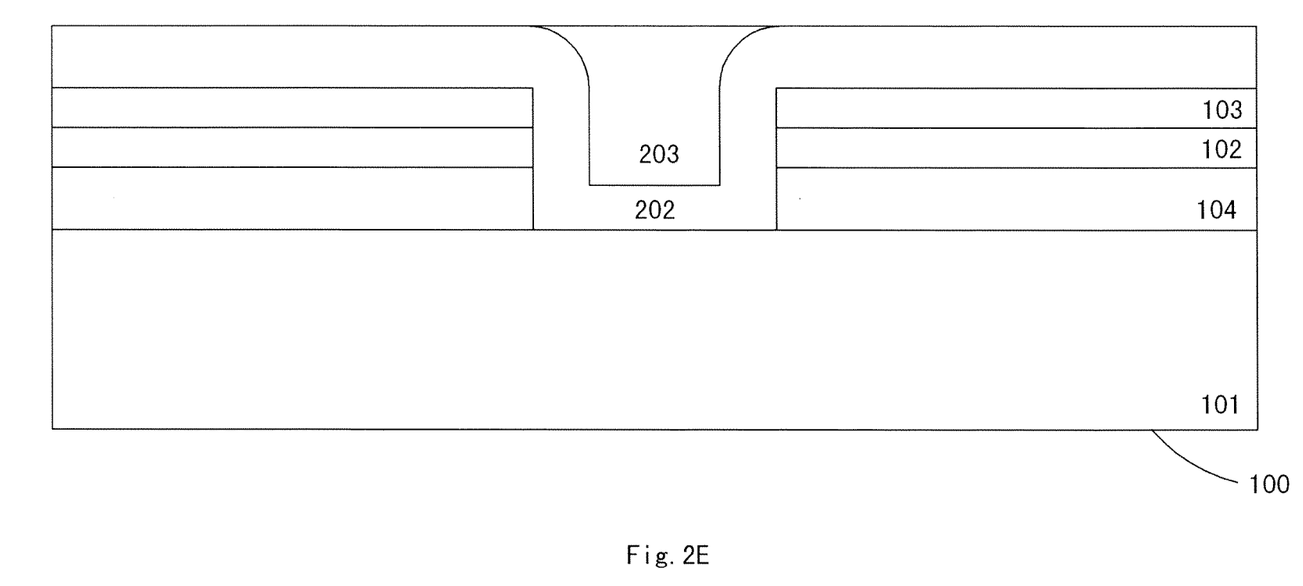
FIG. 2E shows the fifth step of a method for manufacturing a semiconductor device according to an exemplary embodiment of the invention.

FIG. 2E shows the fifth step of a method for manufacturing a semiconductor device according to an exemplary embodiment of the invention. In this step, a dielectric material 203 is formed on the stress film 202 to fill the isolating trench. The dielectric material 203 may be formed by deposition, for example. The dielectric material 203 may for example comprise, but not limited to, a material or a combination of materials selected from a group made up of the following materials: silicon dioxide, silicon nitride, etc.

Optionally, the process of chemical mechanical polishing (CMP) may be performed after the dielectric material 203 is formed on the stress film 202.

Figure 2F:
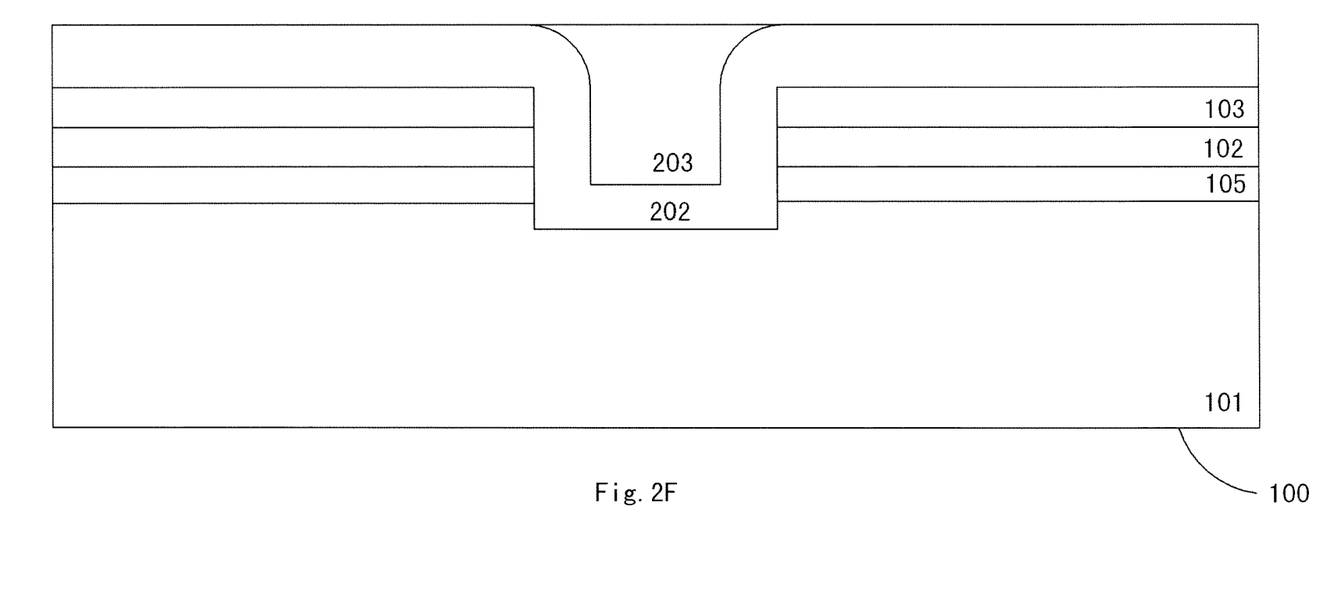
FIG. 2F shows the sixth step of a method for manufacturing a semiconductor device according to an exemplary embodiment of the invention.

FIG. 2F shows the sixth step of a method for manufacturing a semiconductor device according to an exemplary embodiment of the invention. In this step, the non-crystallized part 104 of the base layer 101 is recrystallized so as to form a strained part 105 of the base layer 101. By such a step of recrystallization, the strain is transferred from the stress film 202 to the part 105 of the base layer 101.

Where the stress film 202 is formed as a stress film having a tensile strain, the strained part 105 of the base layer 101 has a tensile strain. Where the stress film 202 is formed as a stress film having a compressive strain, the strained part 105 of the base layer 101 has a compressive strain.

In an example, the non-crystallized part of the base layer is recrystallized by thermal annealing. The thermal annealing may for example be performed at the temperature of 600-800° C.

The strained part 105 of the base layer 101 may be adjacent to the stress film 202. In an example where the substrate 100 comprises a buried insulating layer (not shown) in the base layer 101, the strained part 105 of the base layer 101 may be located above the buried insulating layer.

Figure 2G:
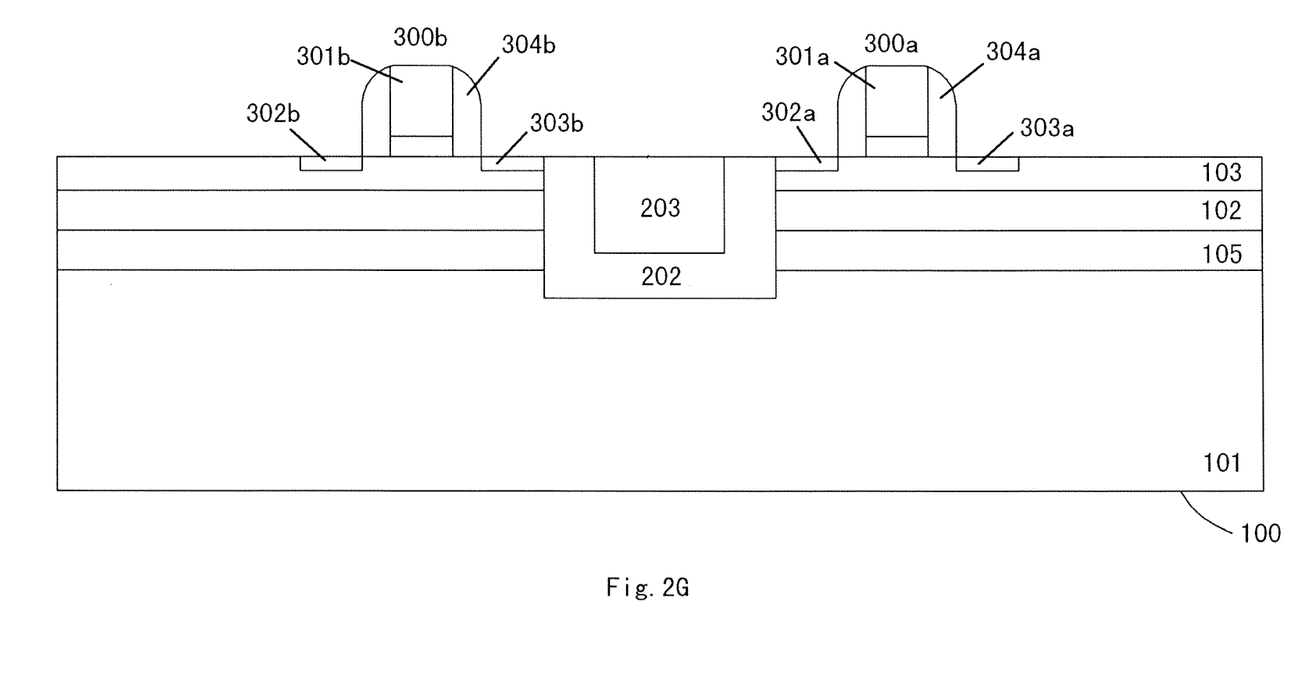
FIG. 2G shows the seventh step of a method for manufacturing a semiconductor device according to an exemplary embodiment of the invention.

FIG. 2G shows the seventh step of a method for manufacturing a semiconductor device according to an exemplary embodiment of the invention. In this step, a first transistor 300a and a second transistor 300b are formed on the substrate 100 on opposite sides of the isolating trench.

In an example, the stress film and the dielectric material on upper surface of the substrate 100 may be removed before forming the first transistor 300a and the second transistor 300b. For example, this may be achieved by first etching the stress film on the upper surface of the substrate and then etching the dielectric material so that the dielectric material is flushed with the stress film. Of course, it may also be that the dielectric material is first etched and the stress film is then etched.

As an example, the first transistor 300a and the second transistor 300b may be formed in the following way: a first gate stack 301a and a second gate stack 301b are formed on the semiconductor layer 103 on opposite sides of the isolating trench, a first source region 302a and a first drain region 303a are formed on opposite sides of the first gate stack 301a, and a second source region 302b and a second drain region 303b are formed on opposite sides of the second gate stack 301b. The first gate stack may comprise a first gate dielectric and a first gate electrode formed on the first gate dielectric. The second gate stack may comprise a second gate dielectric and a second gate electrode formed on the second gate dielectric. Optionally, after the first gate stack 301a and the second gate stack 301b are formed, a first spacer isolating layer 304a may be formed on a sidewall of the first gate stack 301a, and a second spacer isolating layer 304b may be formed on a sidewall of the second gate stack 301b. It is worth noting that, the structure of the first and second transistors of the invention is not limited to that shown in FIG. 2G, and the first and second transistors may also be other type of transistor. Those skilled in the art may select or determine the particular structure of the first and second transistors as desired.

The first and second transistors 300a and 300b may both be an N-type transistor or a P-type transistor. In an example, one of the first and second transistors 300a and 300b is an N-type transistor, the other is a P-type transistor, and such first and second transistors may constitute a CMOS device. In such a case, each and every portion of the base layer under both of the N-type transistor and the P-type transistor has at least a strained part, wherein the strained part of the portion of the base layer under the N-type transistor has a tensile strain, and the strained part of the portion of the base layer under the P-type transistor has a compressive strain. Thus, both the speeds of the N-type transistor and the P-type transistor may be increased, thereby improving the performance of the semiconductor device as a whole.

While the exemplary embodiments of the invention have been described in detail with reference to the drawings, such a description is to be considered illustrative or exemplary and not restrictive; the invention is not limited to the disclosed embodiments. Various embodiments described in the above and the claims may also be combined. Other variations to the disclosed embodiments can be understood and effected by those skilled in the art in practicing the claimed invention, from a study of the drawings, the disclosure, and the appended claims, which variations also fall within the protective scope of the invention.

In the claims, the word "comprising" does not exclude the presence of other elements or steps, and "a" or "an" does not exclude a plurality. The mere fact that certain measures are recited in mutually different dependent claims does not indicate that a combination of these measures cannot be used to advantage.

What is claimed is:

1. A semiconductor device comprising:
    a substrate, which comprises a base layer, an insulating layer, and a semiconductor layer, the insulating layer being on the base layer, and the semiconductor layer being on the insulating layer; and
    a first transistor and a second transistor, which are formed on the substrate, the first and second transistors being isolated from each other by a trench isolation structure in the substrate,
    wherein at least a part of the base layer under at least one of the first and second transistors is strained, and the strained part of the base layer is adjacent to the insulating layer, and
    wherein the trench isolation structure comprises a stress film and a dielectric material, the stress film being on the bottom and an inner wall of the trench of the trench isolation structure, and the dielectric material being on the stress film to fill the trench of the trench isolation structure.

2. The semiconductor device as claimed in claim 1, wherein the trench isolation structure passes through the semiconductor layer, the insulating layer and a part of the base layer.

3. The semiconductor device as claimed in claim 1, wherein the stress film comprises nitride.

4. The semiconductor device as claimed in claim 1, wherein the strained part of the base layer is adjacent to the stress film of the trench isolation structure.

5. The semiconductor device as claimed in claim 1, wherein the substrate further comprises a buried insulating layer in the base layer, and the strained part of the base layer is located above the buried insulating layer.

6. The semiconductor device as claimed in claim 1, wherein the first transistor comprises a first gate stack, a first source region, and a first drain region, the first gate stack being on the semiconductor layer, and the first source region and the first drain region being on opposite sides of the first gate stack; and the second transistor comprises a second gate stack, a second source region, and a second drain region, the second gate stack being on the semiconductor layer, and the second source region and the second drain region being on opposite sides of the second gate stack.

7. The semiconductor device as claimed in claim 1, wherein one of the first and second transistors is an N-type transistor, and the other one of the first and second transistors is a P-type transistor.

8. The semiconductor device as claimed in claim 7, wherein each and every portion of the base layer under both of the N-type transistor and the P-type transistor has at least a strained part.

9. The semiconductor device as claimed in claim 8, wherein the strained part of the portion of the base layer under the N-type transistor has a tensile strain, and the strained part of the portion of the base layer under the P-type transistor has a compressive strain.

* * * * *